(12) United States Patent
Bauer

(10) Patent No.: US 8,324,103 B2
(45) Date of Patent: Dec. 4, 2012

(54) VIAS AND METHOD OF MAKING

(75) Inventor: Tomas Bauer, Bro (SE)

(73) Assignee: Silex Microsystems AB, Jarfalla (SE)

( * ) Notice: Subject to any disclaimer, the term of this patent is extended or adjusted under 35 U.S.C. 154(b) by 646 days.

(21) Appl. No.: 12/162,600

(22) PCT Filed: Jan. 31, 2007

(86) PCT No.: PCT/SE2007/050052
§ 371 (c)(1),
(2), (4) Date: Oct. 27, 2009

(87) PCT Pub. No.: WO2007/089206
PCT Pub. Date: Aug. 9, 2007

(65) Prior Publication Data
US 2010/0052107 A1 Mar. 4, 2010

(30) Foreign Application Priority Data
Feb. 1, 2006 (SE) ........................................ 0600214

(51) Int. Cl.
*H01L 21/44* (2006.01)
(52) U.S. Cl. ........................ 438/677; 438/667; 438/673
(58) Field of Classification Search .................. 438/667, 438/673, 677; 257/621
See application file for complete search history.

(56) References Cited

U.S. PATENT DOCUMENTS

| 3,787,252 | A | 1/1974 | Filippazzi et al. | |
|---|---|---|---|---|
| 3,982,268 | A | 9/1976 | Anthony et al. | |
| 5,654,232 | A | 8/1997 | Gardner | |
| 6,303,469 | B1 | 10/2001 | Larson et al. | |
| 2002/0074615 | A1 | 6/2002 | Honda | |
| 2002/0119640 | A1 | 8/2002 | Gonzalez | |
| 2004/0187975 | A1* | 9/2004 | Suemasu et al. | 148/522 |
| 2005/0064707 | A1 | 3/2005 | Sinha | |
| 2005/0067688 | A1* | 3/2005 | Humpston | 257/704 |
| 2005/0186770 | A1 | 8/2005 | Kirby et al. | |
| 2006/0148250 | A1 | 7/2006 | Kirby | |

FOREIGN PATENT DOCUMENTS

| EP | 1577942 | A2 | 3/2005 |
|---|---|---|---|
| EP | 1575084 | A2 | 9/2005 |
| WO | 9531006 | A1 | 11/1995 |
| WO | 01/67494 | A2 | 9/2001 |
| WO | 2004084300 | A1 | 9/2004 |
| WO | 2005101475 | A1 | 10/2005 |

* cited by examiner

*Primary Examiner* — Tucker Wright
(74) *Attorney, Agent, or Firm* — Pierce Atwood LLP; Kevin M. Farrell; Weber Hsiao

(57) ABSTRACT

The invention relates to a method of providing a planar substrate with electrical through connections (vias). The method comprises providing a hole in said substrate and a treatment to render the substrate surface exhibiting a lower wettability than the walls inside the hole. The planar substrate is exposed to a molten material with low resistivity, whereby the molten material is drawn into the hole(s). It also relates to a semiconductor wafer as a starting substrate for electronic packaging applications, comprising low resistivity wafer through connections having closely spaced vias.

15 Claims, 15 Drawing Sheets

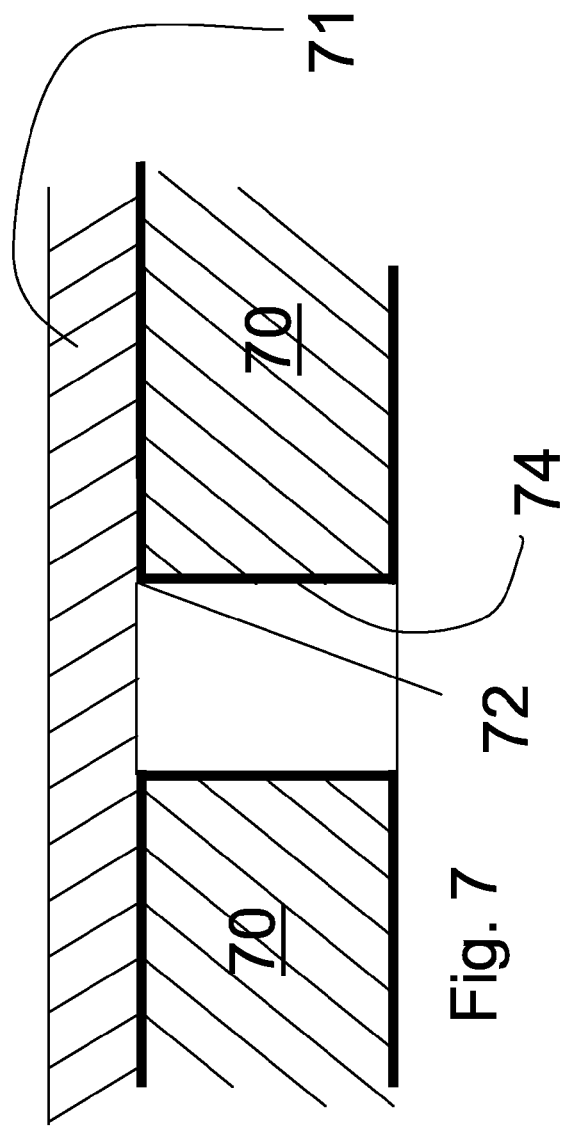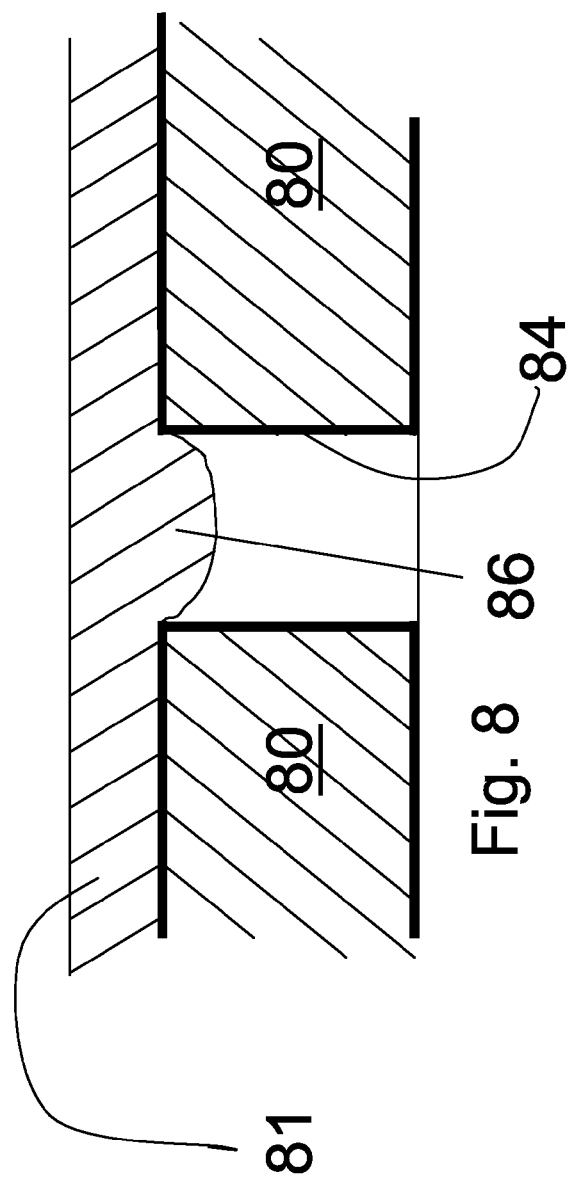

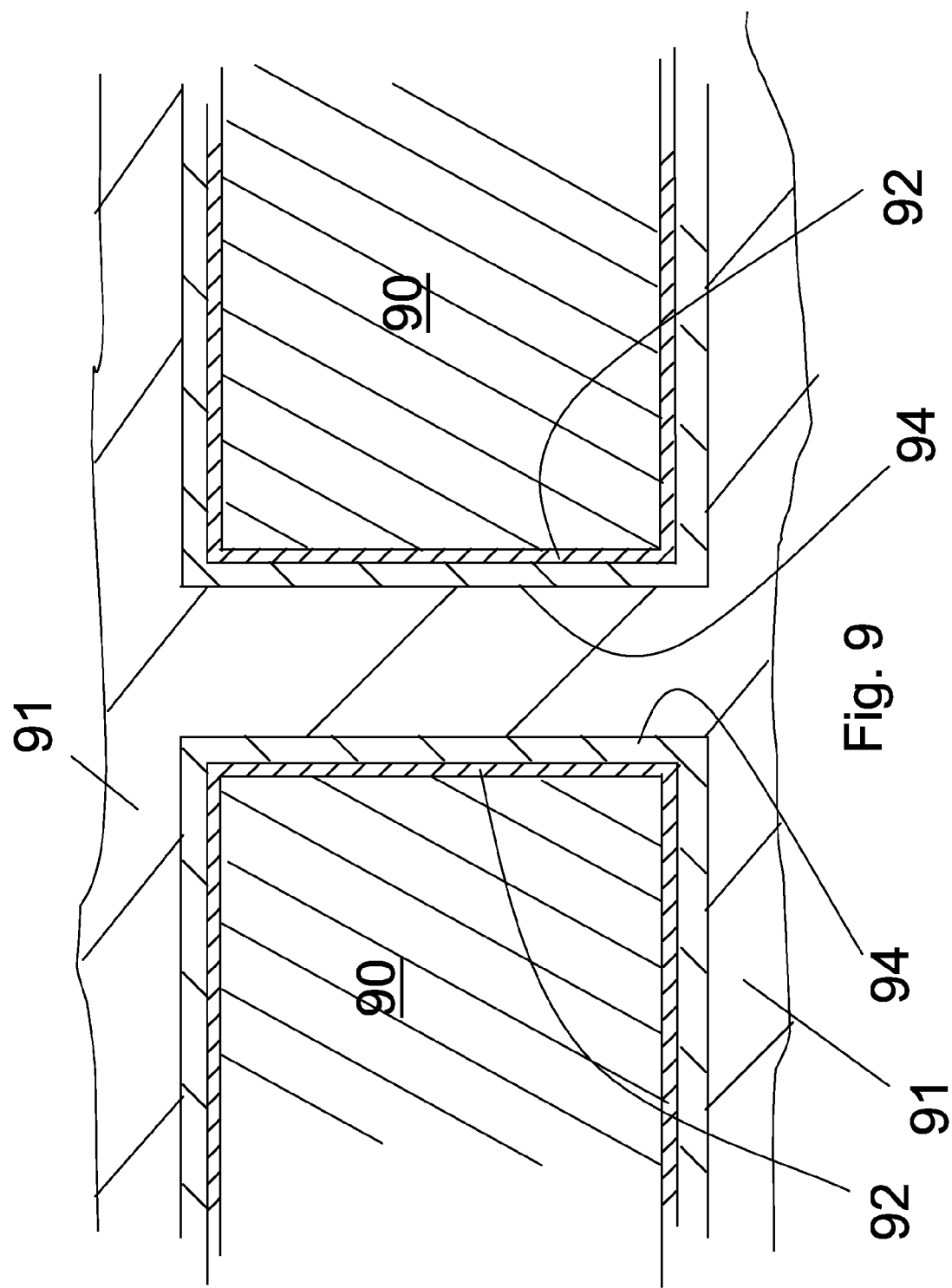

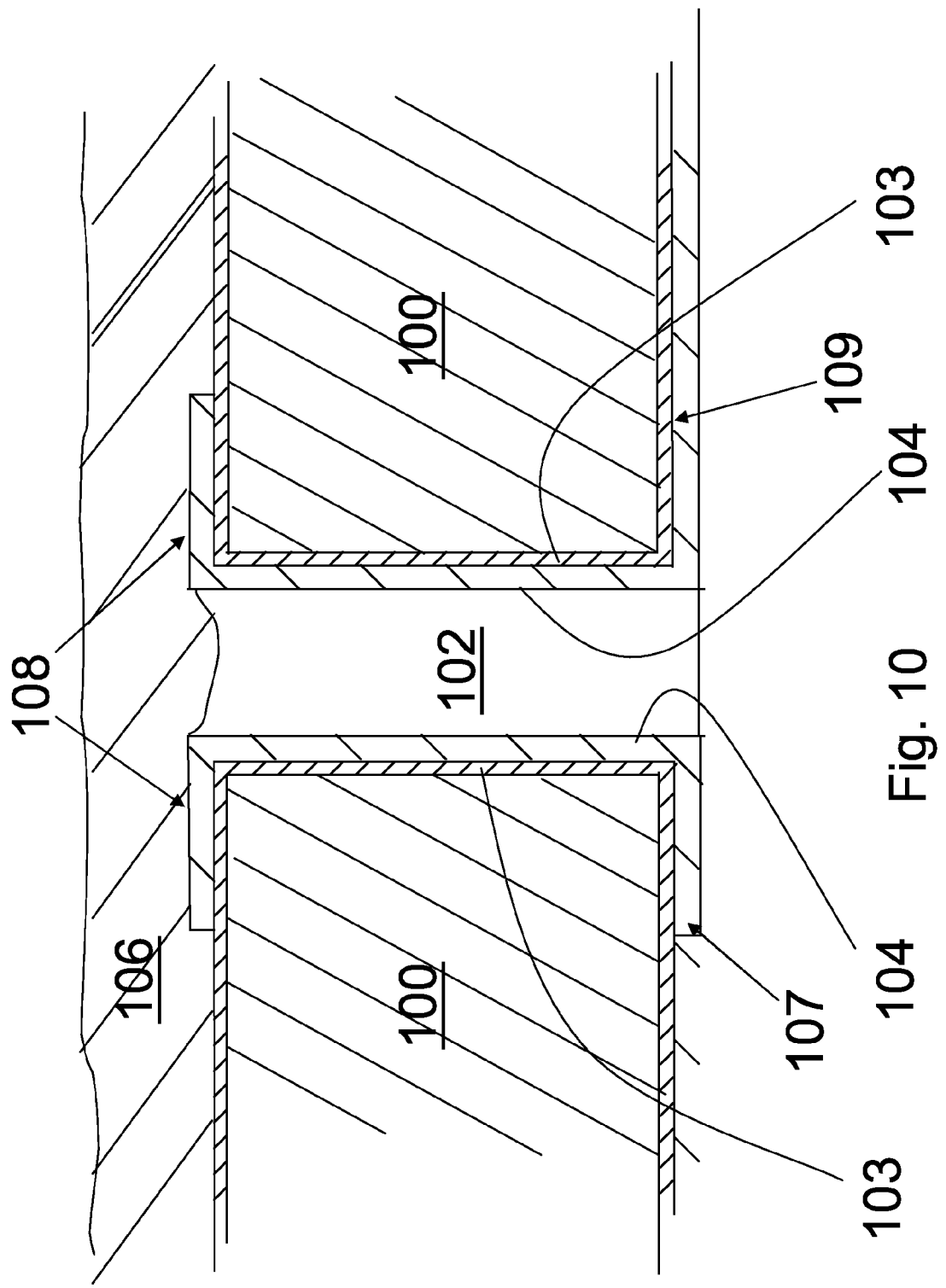

VIAS AND METHOD OF MAKING

The present invention relates to means and methods for providing electrical connections between the two sides of a semiconductor wafer, suitably processed to comprise MEMS devices such as sensors and actuators, RF switches, SLM (Spatial Light Modulators), image devices on one side to be connected with other devices on the other side, through said wafer.

BACKGROUND OF THE INVENTION

Applicants own Swedish patent SE-0300784-6 (publication No. 526 366) discloses and claims through connections (also referred to as vias) made in a wafer material from the native wafer itself. The vias thereby comprises the same material as the remainder of the wafer and will thus be capable of being processed in a more versatile manner, as describe in detail in said application, the disclosure of which is incorporated herein in its entirety by reference.

However, for certain applications the resistivity that is attainable in these prior art vias may be too high, and it would be desirable to provide vias with very low resistivity.

It is known to provide vias made of metal, but the conventional methods used (sputtering, plating, or evaporation methods) are all suffering from the problem that it is difficult to fill very small holes with them without getting voids.

In U.S. Pat. No. 5,654,232 (Gardner) there is disclosed a method of making an electrical interconnection by melting copper into recesses or grooves made in a dielectric layer on a semi-conductor substrate. The prior art process according to U.S. Pat. No. 5,654,232 comprises making a recess in a dielectric layer which is provided on a semi-conductor substrate, and by providing a wetting-layer allowing copper metal to fill the recess. The recesses are comparatively shallow and do not extend through the wafer.

Other disclosures relating to this technology is to be found i.a. in US20040187975 (Tatsuo et al), 20030119 (Yamamoto), US20040043615 (Satoshi et al), U.S. Pat. No. 6,002,177 (Gaynes et al), US2005023675 (Mitsuo et al), US20010045654 (Givens), US20050801 (Leung) and US20050801 (Hara).

In the industry there is a strive to make component and wafer stacking as compact as possible, and improvements in via technology are therefore sought for.

SUMMARY OF THE INVENTION

The object of the present invention is to provide a new method that enable very small holes to be filled with metal, thereby creating low ohmic metallic vias, enabling a closer spacing of the obtained vias.

This object is achieved with the novel method as defined in claim 1.

BRIEF DESCRIPTION OF THE DRAWINGS

FIG. 7 illustrates the problem of filling narrow holes with metal;

FIG. 8 illustrates using a paste;

FIG. 9 shows a wafer with a via and molten metal;

FIG. 10 shows an embodiment where polysilicon has been applied;

FIG. 12a shows routing according to the invention in a top view;

FIG. 12b is a cross-section along A-A in FIG. 12a;

DETAILED DESCRIPTION OF THE INVENTION

The invention relates to a method of providing a planar substrate with low ohmic (e.g. metallic) electrical through connections, or as they will referred to below, vias.

The method according to the invention comprises the provision of a suitable substrate. This substrate is normally a standard semiconductor wafer, commonly employed for the manufacture of various semiconductor devices. The planar substrate is preferably a semiconductor wafer, preferably selected from silicon, doped silicon, GaAs, InP, SiC etc. The wafer is normally 0,300-0,675 mm thick.

In particular the invention is applicable to cases where it is desirable to provide connections between a front side and a back side of such a wafer, where there are high demands on the resistivity in said connections to be as low as possible, in particular for RF applications.

Figure 1:
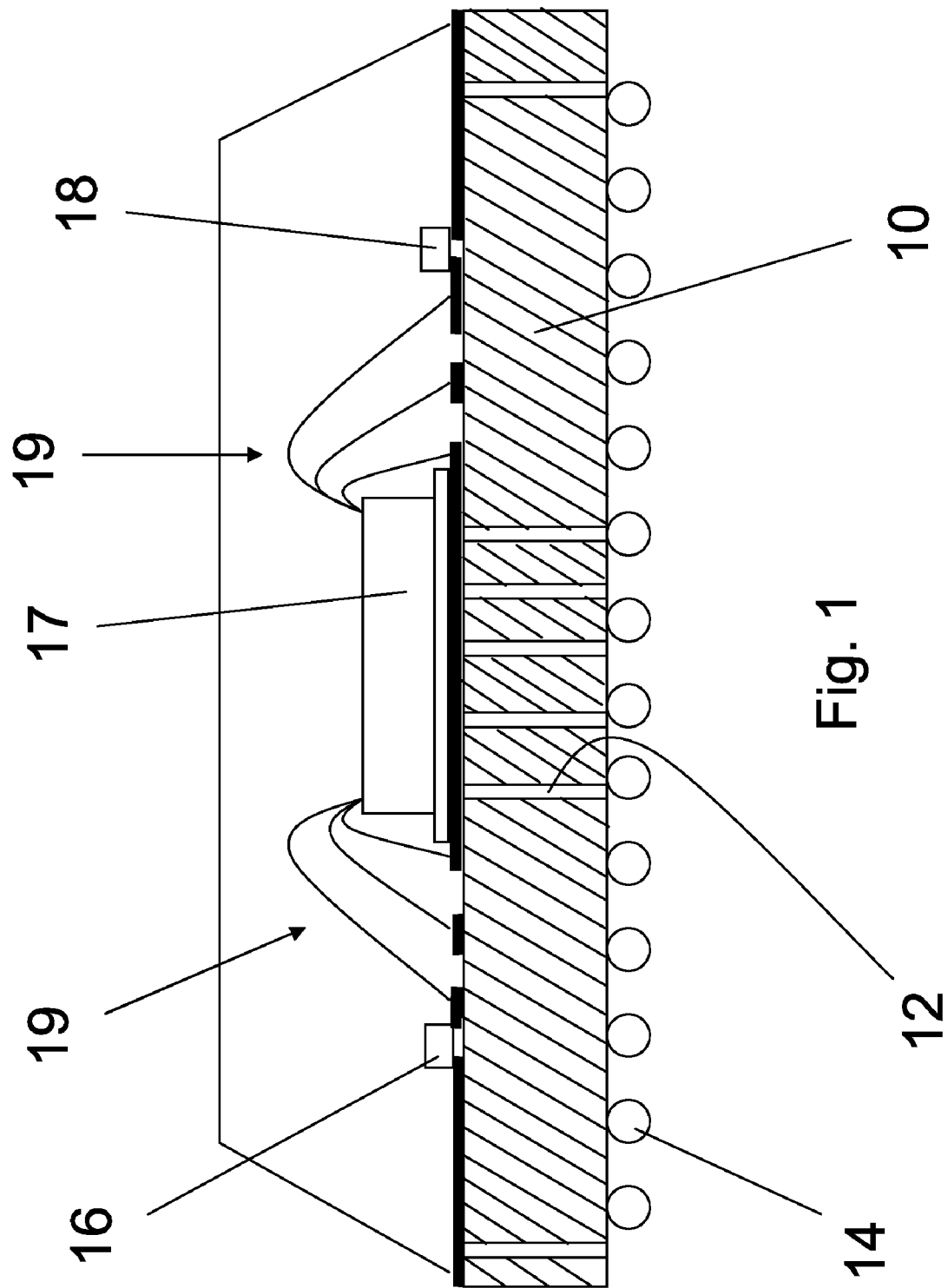
FIG. 1 schematically illustrates a prior art structure with components on a laminate board.

FIG. 1 schematically illustrates a typical prior art structure comprising a laminated board (e.g. PBGA) 10. It has electrical through connections (vias) 12, and a plurality of solder bumps 14 on the back side of the PBGA 10 appropriately routed to the vias 12. On the top side there are components 16, 17, 18 attached to the PGBA 10, and coupled to the back side by the vias. The components are interconnected by wire bonding 19. This prior art principle is restricted in how closely spaced the vias can be arranged.

Figure 2:
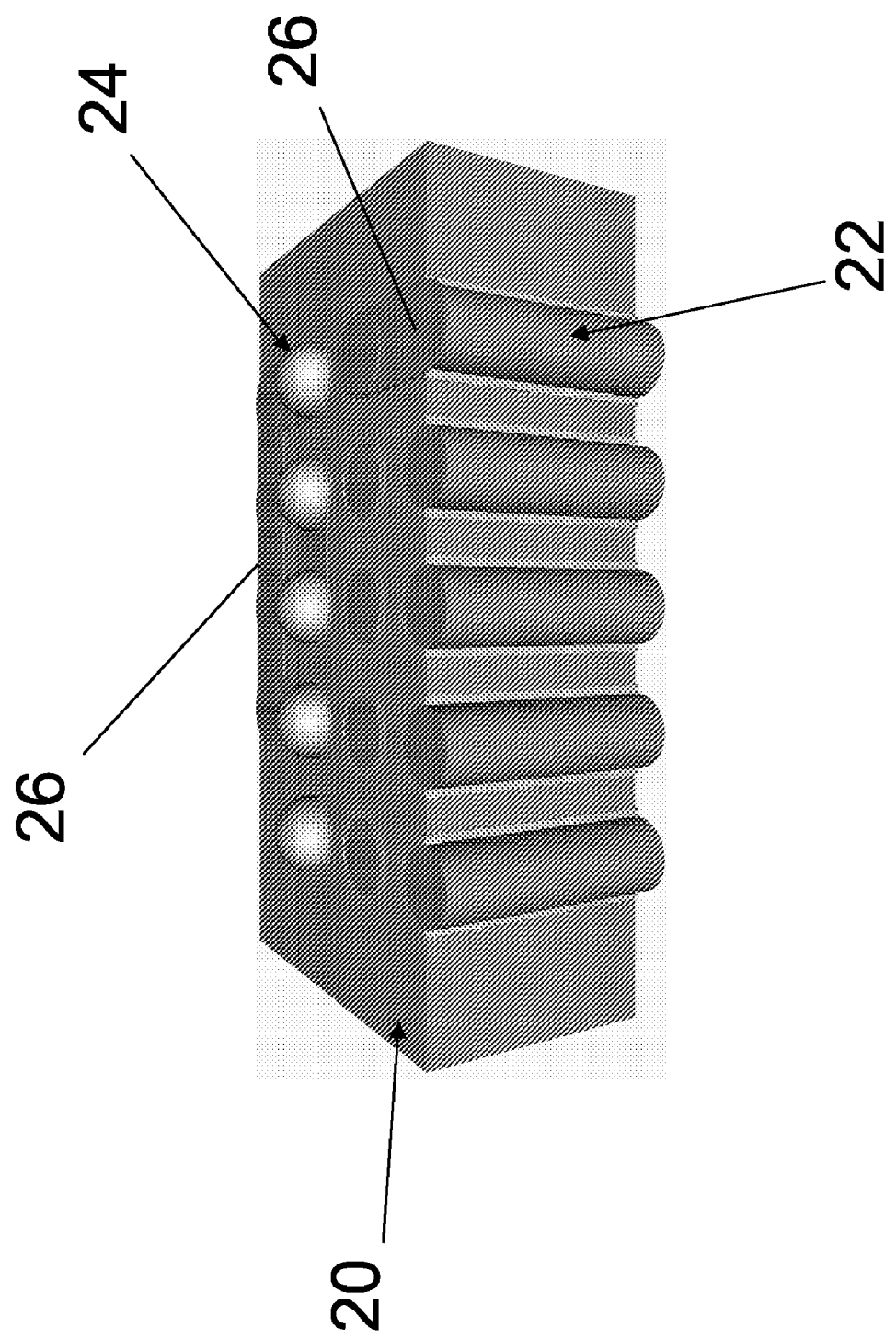
FIG. 2 illustrates applicants prior art via technique.

In FIG. 2 there is shown a silicon wafer 20 having wafer native low resistivity silicon vias 22. On the side shown there are solder bumps 24 for soldering or flip-chip mounting. There are also provided routing structures 26. With this method a via spacing of about 50 μm is attainable.

Figure 3:
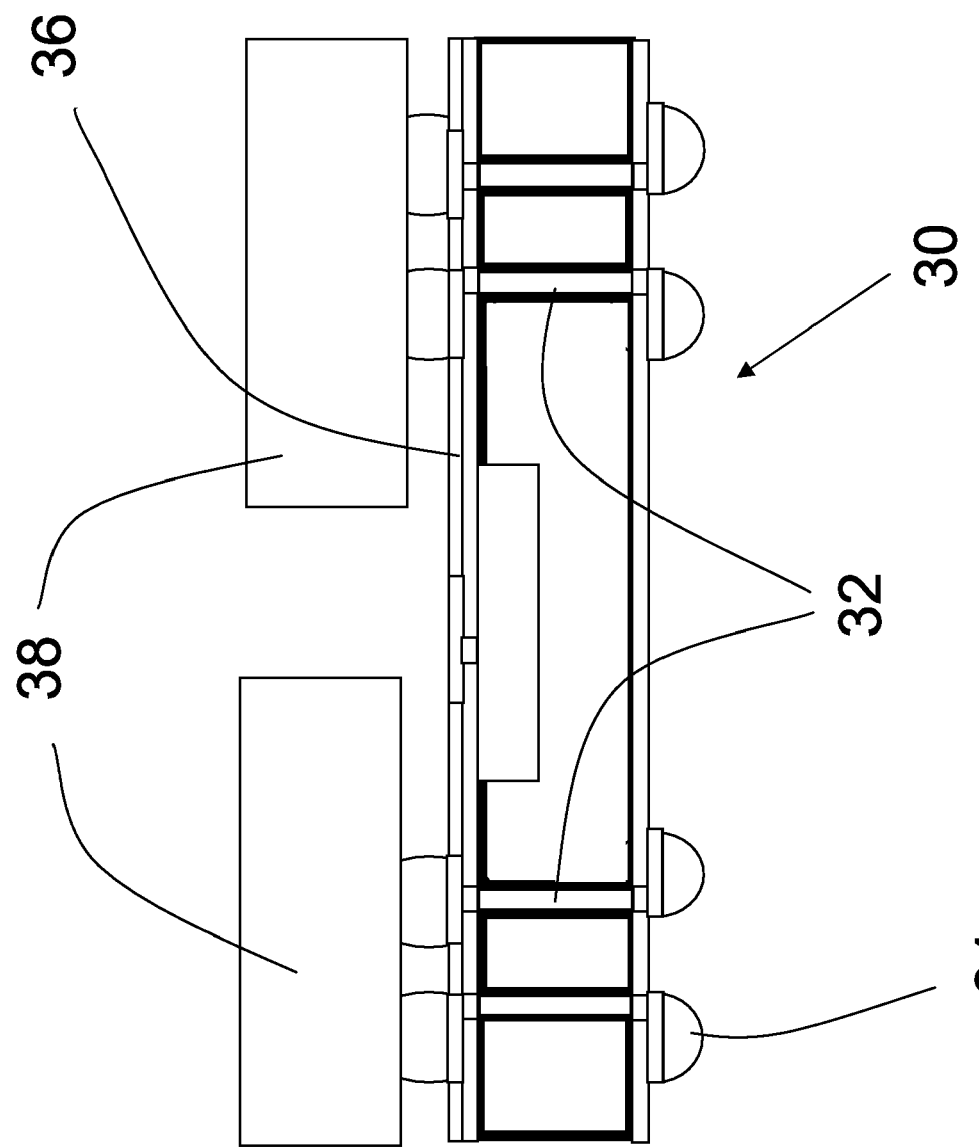
FIG. 3 shows a novel packaging approach exemplified by an RF component attached to an interposer substrate comprising silicon through metallic vias according to the invention.

FIG. 3 illustrates a structure that can be made in accordance with the invention and which forms one aspect of the present invention, namely an interposer substrate, i.e. silicon wafer as a starting substrate for "System On Chip" or "System In Package", or "Wafer Level Chip Scale Packaging" (WLCSP), using 3D interconnect through silicon metallic low ohmic metallic vias.

FIG. 3 discloses a strating substrate ("interposer") 30 having low ohmic silicon through vias 32 made by the method according to the invention. On this starting substrate there can be provided additional features such as solder bumps 34 and metal routing 36 for various packaging concepts and for different types of components 38.

Figure 4:
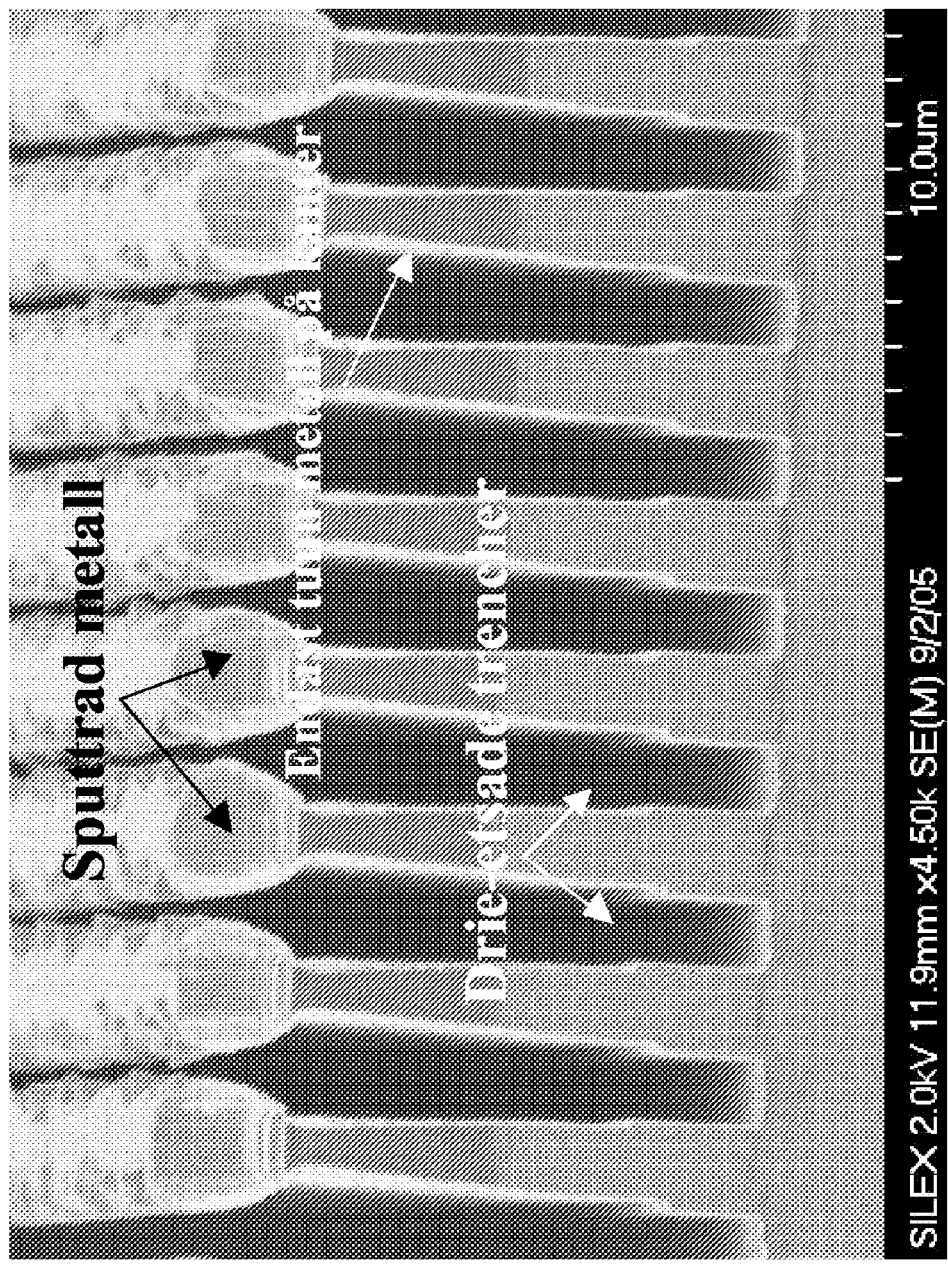
FIG. 4 shows etched trenches illustrating the difficulty in obtaining holes filled with metal by sputtering.

In FIG. 4 a problem in the prior art methods for coating narrow trenches by e.g. sputtering is shown. As can be clearly seen the metal does not fill the trenches but stays on top and clogs the opening of the trenches.

Figure 5:
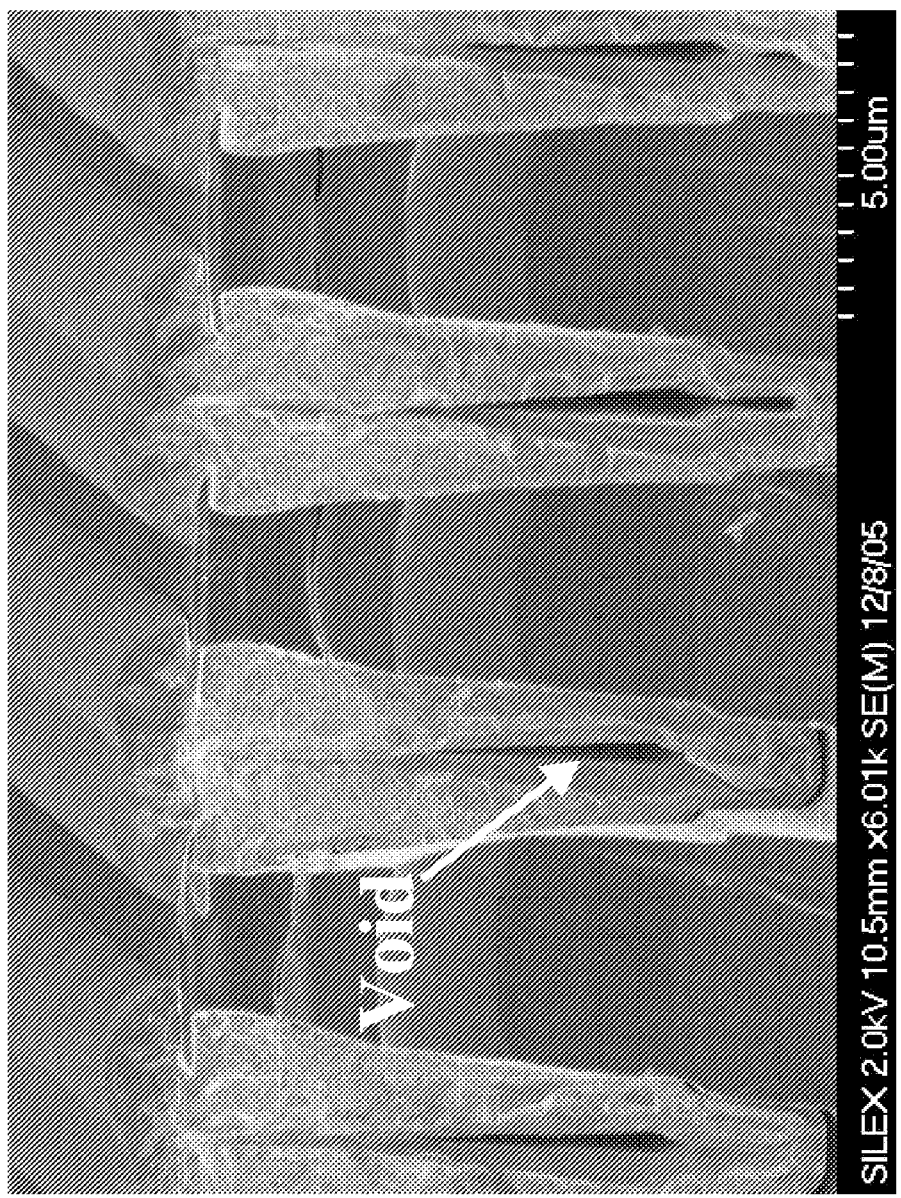
FIG. 5 illustrates trenches filled by plating.

FIG. 5 illustrates the problem associated with filling a hole with molten metal. The ambient atmosphere will cause voids to be formed, and thus, the vias will not be solid throughout.

Figure 6:
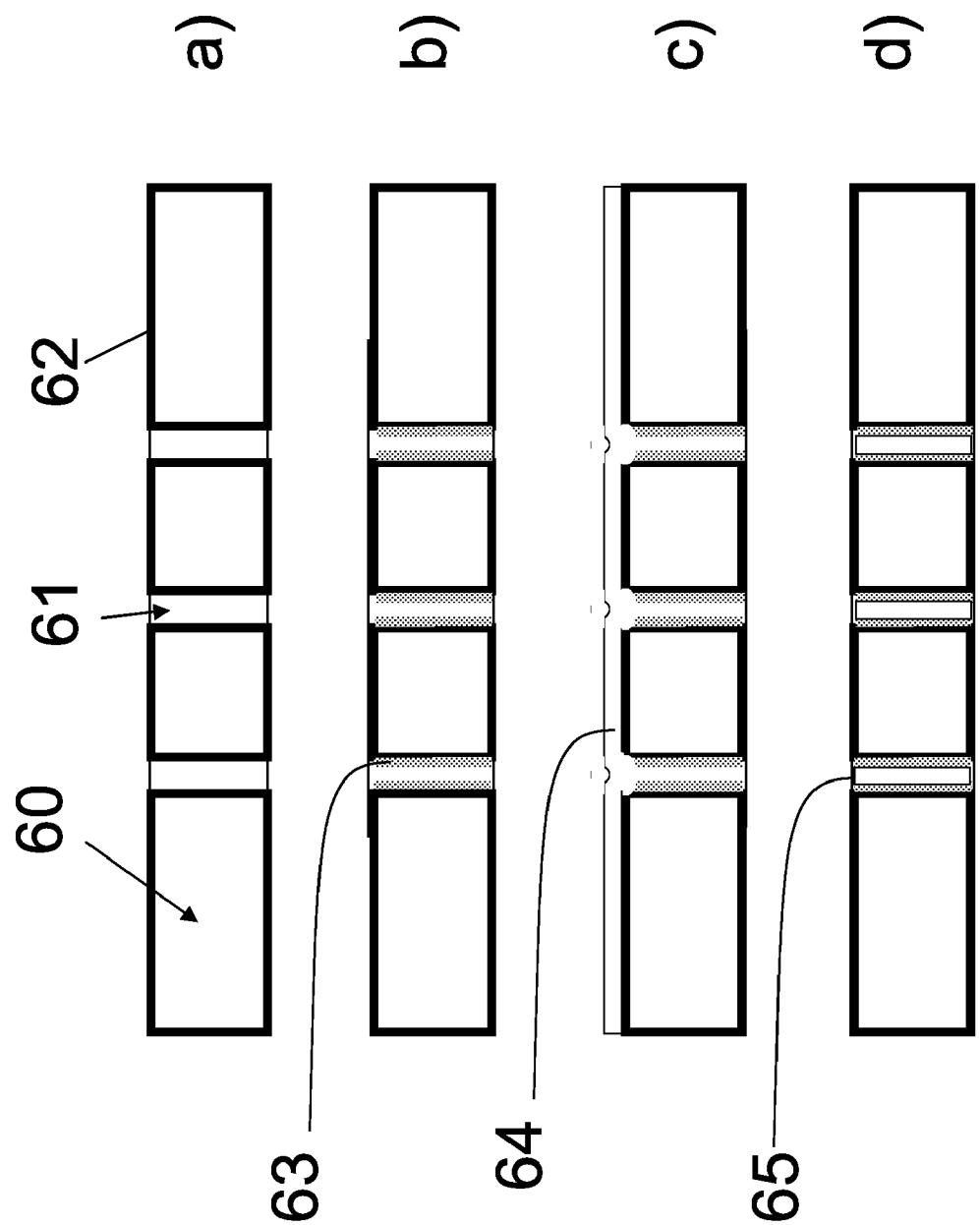
FIG. 6 illustrates the principle of the novel process according to the invention of obtaining vias.

The method according to the invention will now be described in detail, first with reference to FIG. 6 for a general description.

The wafer 60 is provided with at least one hole 61 in said substrate (FIG. 6a), the hole having a first opening on one side of the substrate and a second opening on the other (opposite) side of the substrate. The hole essentially defines the diameter of the via that is eventually obtained. The second opening can have the same diameter as the first opening, but in preferred embodiments there is provided a plurality of smaller holes instead of the single second hole. These smaller holes can be provided in a membrane extending across the wider diameter lumen of the hole, and form venting holes. The purpose of providing smaller second openings is to allow gas (air) to exit from the hole while preventing molten metal (by surface tension) to escape. Thereby the metal will fill the hole completely leaving no voids inside. This will be described further below.

The hole suitably is circular and has a diameter of about 20 µm. The diameter can of course vary and can be 10-100, preferably 15-30 µm. Suitably a dry etch process such as DRIE is used for making the hole(s). Laser drilling may be possible.

After having provided the hole(s) in the desired configuration, then the substrate is subjected to a process such that the substrate surface will exhibit a lower wettability than the side walls inside the hole. This can be done by first depositing an oxide layer 62 (FIG. 6a) and then depositing a wetting material 63 (FIG. 6b), suitably a metal, thereon by e.g. sputtering, evaporation or plating, whereby the entire wafer and the walls in the hole will be coated. For removing said material from the surface of the wafer, and still leave material left in the hole(s), an anisotropic plasma etch can be applied from above.

Alternatively the wafer is covered with a resist before the deposition of the metal, and a lift-off is performed to remove the metal from the surface, which is necessary with gold. Alternatively shadow mask patterning can be used for metal deposition. Standard lithography and etching can also be employed.

In an alternative embodiment for providing a non-wetting surface on the wafer, in contrast to the a surface having "low wettability" as discussed above, the wafer is provided with e.g an oxide layer or a layer of e.g. Ti. Other suitable materials of choice apparent to the skilled man can be used to provide a non-wettable surface or at least a surface having lower wettability than that present in the holes.

The walls inside the hole are suitably provided with a layer of a wettable material, e.g. Au.

If this substrate is exposed to a molten material (FIG. 6c) having a suitable low resistivity, such as a metal or metal alloys 64, the difference in wetting capacity of the surface and the side walls in the holes, respectively, will cause the molten metal to be drawn into the holes (shown at 65; FIG. 6c), by capillary force and/or by the wetting power of the side wall surfaces.

In a first embodiment the substrate is provided with a layer of said material with low resistivity by depositing it onto the substrate. Thereafter it is heated so as to melt said material.

In a second embodiment the material is provided on the substrate in a molten state. If a pure metal e.g. Al is used the temperature of the melt is about 600° C., if solder alloys such as Au/Sn is used the temperature is abut 150-400° C.

For various methods of application of metal, see an article entitled "The Use of Solder as an Area array Package Interconnect" in *Chip Scale Review*, September/October-99, wherein methods for Evaporation Bumping, Electroplating Bumping, Meniscus Bumping, Solder Jet Bumping, Wire Bumping, Sphere Welding, Decal Solder Transfer, Tacky Dot Solder Transfer, Pick-and-Place Solder Transfer, Integrated Preform, Print-Detach-Reflow, Print-Reflow-Detach, Dispensing are described.

Preferably the material with low resistivity is selected from Al, Au, Ag, Cu, Sn, solders based on these metals e.g. AgSn, AuSn, but also other metals such as W, Mo, apart from other eutectic materials Au/Si, Au/poly-Si. For the embodiments wherein a paste is used for making the metal vias a number of different compositions or metal combinations can be used. In the tables below a few examples are listed. A eutectic can be advantageous in that the melting point will be considerably lower than for the individual metals themselves. However, a eutectic material will tend to have higher resistivity than pure metals.

In Table 1 there is shown the relevant physical properties of the materials usable in the invention.

TABLE 1

| Metal | Thermal Conductivity | Melting point (K) | Electrical resistivity × $10^{-8}$ $\Omega$m |
|---|---|---|---|
| Al | 238 | 933 | 2.65 |
| Au | 311 | 1336 | 2.35 |
| Ag | 418 | 1234 | 1.59 |
| Cu | 400 | 1356 | 1.67 |
| Sn | 65 | 505 | 10.1 |
| PbSn | 50 | 456 | — |
| Silicon | 170 | 1680 | <5000 |

TABLE 2

| Material | Melting temp. |
|---|---|
| 97/3 Sn/Cu | Approx. 300° C. |
| 80/20 Au/Sn | Approx. 280° C. |
| 36/62/2 Pb/Sn/Ag | Approx. 179° C. |
| 96.5/3/0.5 Sn/Ag/Cu | Approx. 277° C. |
| 88/12 Au/Ge | Approx. 356° C. |
| 96/4 Au/Si | Approx. 363° C. |

The substrate made as described above is usable as a starting material for making devices for RF applications, in that the substrate has a first side to which at leas one electrical component can be attached, and a second side to which at least a second component can be attached. In view of the starting wafer comprises a plurality of electrical through connections (vias) according to the invention extending between said first side and said second side, connection can be made between said components.

Due to the vias comprising a low resistivity material the starting material will be suitable for RF applications, see FIG. 3.

There are several aspects of the invention and a number of different embodiments and applications will now be described with reference to the drawing figures.

When attempts have been made to make vias by trying to allow molten material 71 (metal) to flow into a hole in a substrate 70 (FIG. 7), the corners/edges 72 at the intersection between the planar surface and the opening of the hole will act as a barrier to such flow. This occurs despite the provision of a wetting layer 74 (e.g. Au) in the holes. The methods used include pouring molten metal on the surface, immersing a wafer with hole in a molten metal bath, or applying a layer of metal on top of the surface and heating to the melting temperature of the metal. However, the molten metal will remain on the surface, as is schematically illustrated in FIG. 7.

Alternatively an edge rounding etching procedure according to FIGS. 8 and 9 in the above mentioned patent SE-0300784-6 can be used.

With reference now to FIG. 8, in one embodiment of the present invention that will overcome the above mentioned problem, a "metal paste" 81 in a "semi-liquid" state is applied on the surface of the wafer 80. This can be done by several methods, e.g. simply painting it on, rolling, spraying through nozzles etc.

Once applied, and provided that the viscosity of the paste is adequate, excess paste is scraped off using a squeegee or the like, whereby some paste is "smeared out" passed the edges and is pressed slightly down 86 into the holes, which is schematically illustrated in FIG. 8. The wetting layer 84 will then force the metal to flow down into the hole upon heating to the melting temperature.

Referring to FIG. 9, once the paste has been brought over the edges the wetting layer 94 (gold layer; deposited on an oxide layer 92) will assist in filling the hole with the paste when the wafer 90 is heated to the melting temperature of the paste. FIG. 9 illustrates a situation where the paste has melted 91 and has flown out on the back side of the wafer. At this stage and while still in molten form it is easy to use a squeegee or some other mechanical means for scraping off the excess molten metal to provide a clean wafer with metal filling the holes. Alternatively the excess metal can be grinded or polished away after it has cooled down to solid state.

The wetting layer of gold is applied by a suitable deposition method (e.g. sputtering or any other suitable method) from both sides of the wafer. If applied from only one side there will be an unnecessarily thick layer of gold at the deposition end of the hole. It suffices with a very thin layer to provide the desired wettability, and depositing from both sides minimizes the amount of gold required to achieve a wetting layer.

Although the above method is an improvement over the prior art, the provision of the wetting layer is not entirely uncomplicated, and the properties of the metal required can be difficult to match (low enough melting point for processing and high enough for solder packaging together with low enough resistivity). In particular it can be difficult to cover the hole inside all the way through if deposition is made from one side only. Therefore, deposition often is made from two sides. Nevertheless, the layer inside the hole will exhibit a non-uniform thickness from one opening to the other, and the thickness of gold in the middle area of the hole can be very thin although adequate.

In an alternative approach schematically illustrated in FIG. 10, holes 102 are made in a (silicon) wafer 100, e.g. by DRIE, the wafer is oxidized to provide an oxide layer 103, and a poly-silicon layer 104 is deposited e.g. by LPCVD. This process enables a very uniform thickness of the layer inside the holes, which is not possible in the above described method comprising the deposition gold on the walls inside the hole. Poly-germanium can also be used.

By lithography the wafer is patterned such that the deposited poly-Si will cover only restricted portions around the holes. The exact shape of this pattern will depend i.a. on the volume of the via 102, but would normally be a circular area around the hole.

When the poly-silicon layer has been applied in the desired pattern, gold is deposited 106 on the wafer using any of sputtering, evaporation, screen-printing of paste etc.

Screen-printing on the other hand will result in a situation similar to the one disclosed in FIG. 8, where the gold paste will partially extend down into the holes after printing.

Then the wafer is heated to a temperature of 363° C. or more, whereby the gold and silicon will begin to react and form a eutectic (Au/Si=4/96), and the Au—Si eutectic will become liquid and flow into the hole to fill it up, thus making up the desired via. Put in other words, the poly-silicon will "draw" gold down into the hole in the process of the eutectic being formed, optionally assisted by a vacuum applied from beneath through a vacuum chuck used for holding the wafer in place during processing.

By pattering the back side of the wafer similarly to the side where gold is deposited, it will be possible to control very accurately how the gold will behave when it exits on the back side. I.e. by providing poly-Si in a pattern the Au/Si will flow out exactly in accordance with the pattern.

Referring again to FIG. 10, on the top side of the wafer the poly-silicon has been provided locally 108 only around the hole opening, whereas on the back side the poly-silicon on the left side 107 extends just a short distance and on the right side 109 extends further away. This could form of a routing strip for connecting to other components located at a distance from the via, or could extend all the way to the edge of the chip. There are of course numerous variations and adaptations possible (e.g. also patterning and etching the Au layer to provide a suitable amount for filling the hole), and the skilled man would be able to devise such variations without further inventive work.

Figure 11:
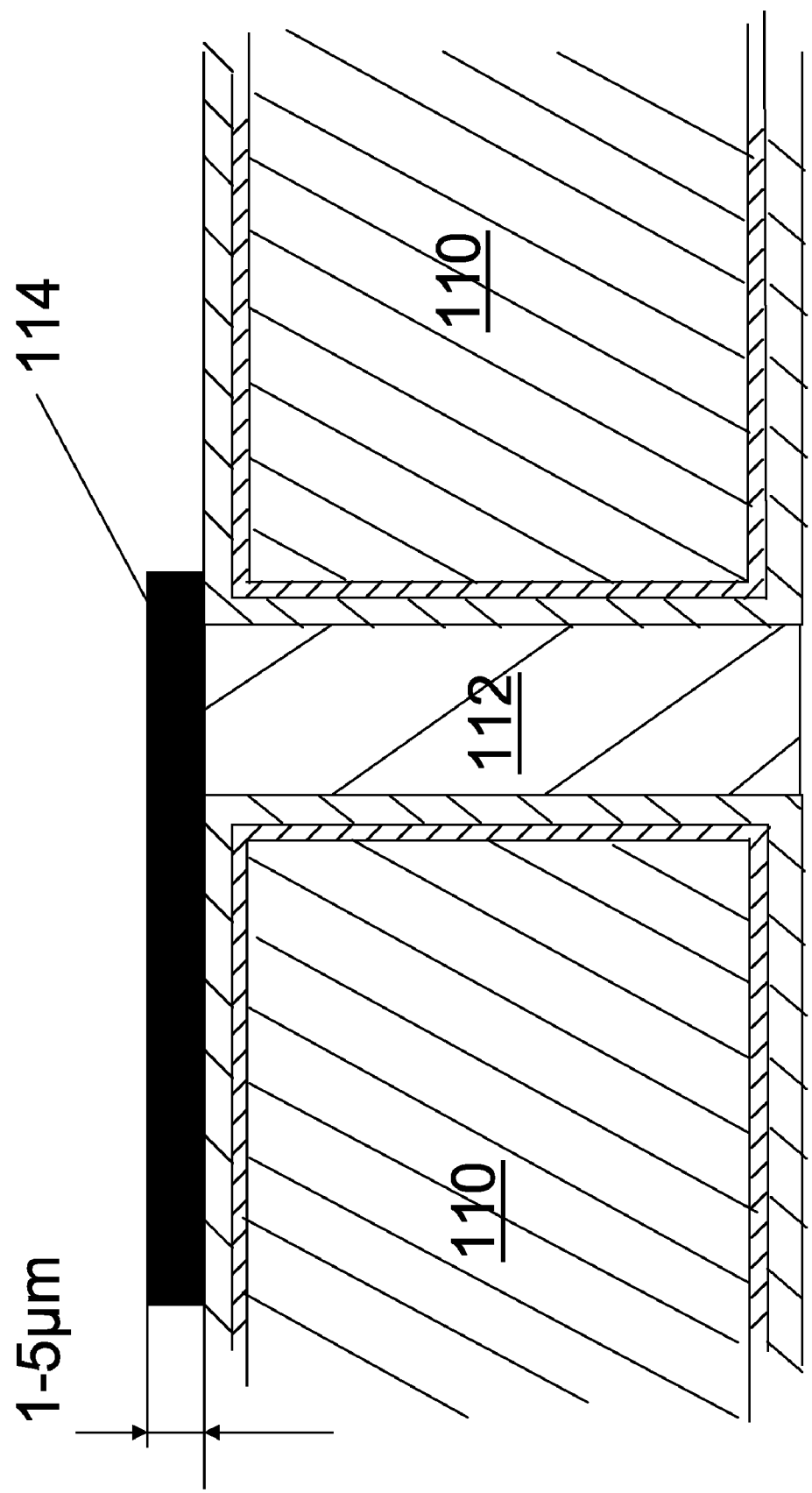
FIG. 11 illustrates a prior art routing structure.

Routing, i.e. the connection of components located spaced apart, has in the prior art been made in ways schematically illustrated in FIG. 2 and FIG. 11. A wafer 110 with vias 112 is provided with a layer of conductive material (e.g. metal) by some deposition method. Then by lithography and etching the routing structures (e.g. conductive strips, pads, etc.) 114 are obtained. The result will be a pattern of metal on top of the wafer, and exhibiting a thickness of a few µm, i.e. slightly elevated above the wafer surface. Also, there will inevitably be contact resistances at the interface between the via and the routing structure. Furthermore, since the thickness cannot be more than a few µm there will be a relatively high resistance in the structures which is a disadvantage for routing purposes.

Figure 12:
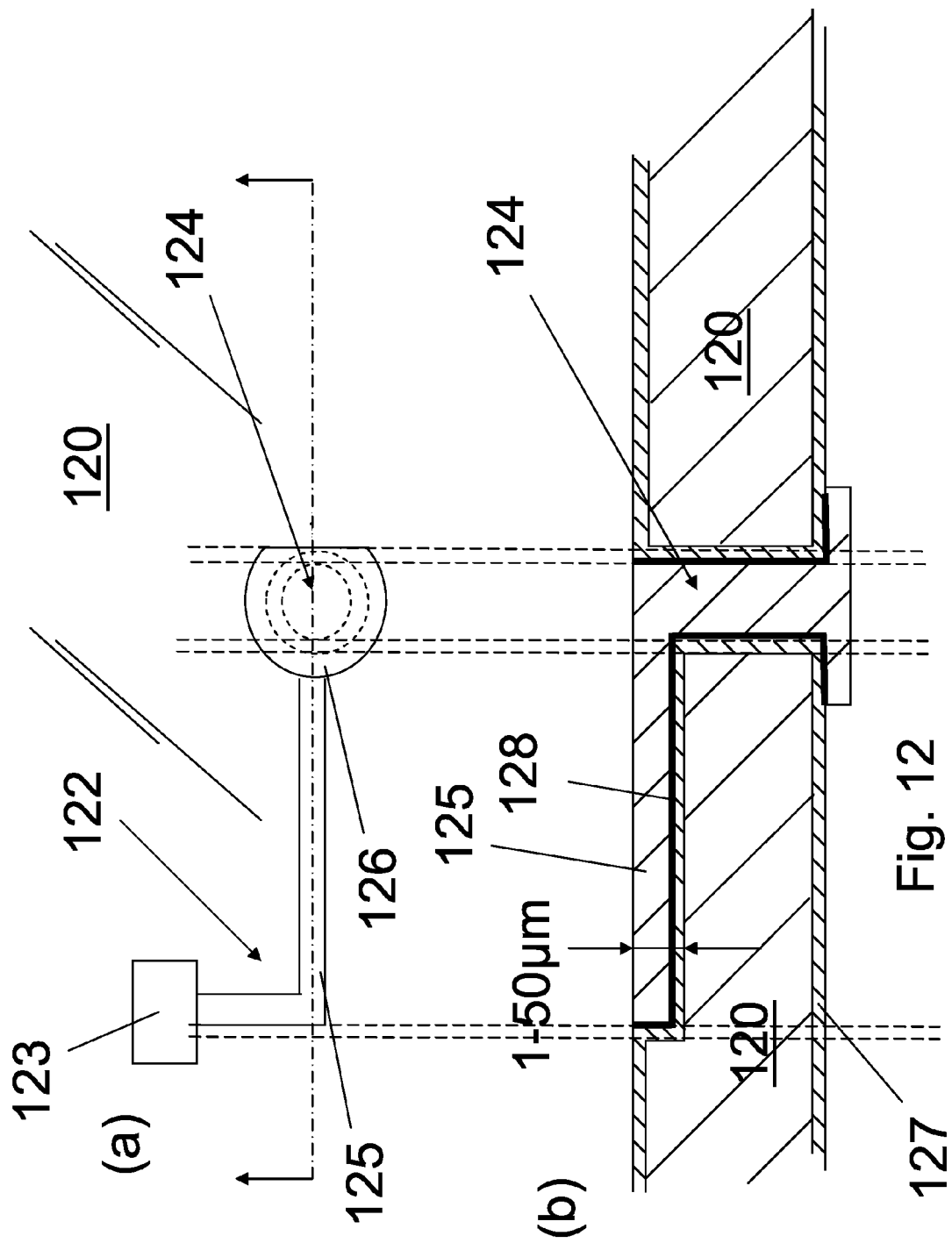

Instead the approach shown in FIG. 12 can be used. FIG. 12a (schematic top view) shows an example of a routing structure 122 on a wafer 120 that can be desirable, i.e. a metal pad 123 located at a distance from the via 124 for connecting some external component, a metal routing strip 125 connecting the pad and the via and a contact area 126 having an extension around the via opening. In FIG. 12b the structure is shown in cross-section (same reference numerals used s in FIG. 12a).

According to the invention the via holes are made as described previously, e.g. by patterning and etching (DRIE). Then a second patterning defining the routing and metal pads is made by lithography. Etching will provide recesses in the wafer to a desired depth. This depth can be accurately controlled and made deep enough (depths of several tens of µm are obtainable) such that when metal subsequently is filled therein, the electric resistance will be very low.

Having provided the via holes and the recesses as described, an oxide layer 127 is provided, e.g by oxidizing the entire wafer 120. Then a wetting layer 128 is applied in the via holes and routing recesses, by any of the methods described earlier.

Suitably a metal paste is applied to the wafer by the "raking" method described above. Heating to melting temperature will cause the metal to fill the holes and the recesses, excess paste is then scraped off or grinded away, to create the via and several separated and insulated routing structure shown in FIGS. 12a and b.

A general problem that was touched upon above, is that when molten metal flows down into the holes it could also exit on the other side. Upon exit the metal may flow out on the surface of the back side if wettability is not reduced. Even if provisions are made to control wettability, e.g. as suggested in connection with FIG. 10, the metal may form undesirably large bumps on the back side. By taking measures to control this bump formation, the bumps can actually be tailored to form solder bumps for the purpose of mounting the chip to other chips or circuit boards or to connect with other components.

According to the invention this is achieved by making the effective area of the back side opening of the via hole smaller than the front side entry opening of the via hole. Thereby the surface tension of the molten metal will prevent the metal from flowing freely out through the back side opening and by tailoring the back side opening area the formation of the bump on the back side can be controlled as to its size.

Figure 13:
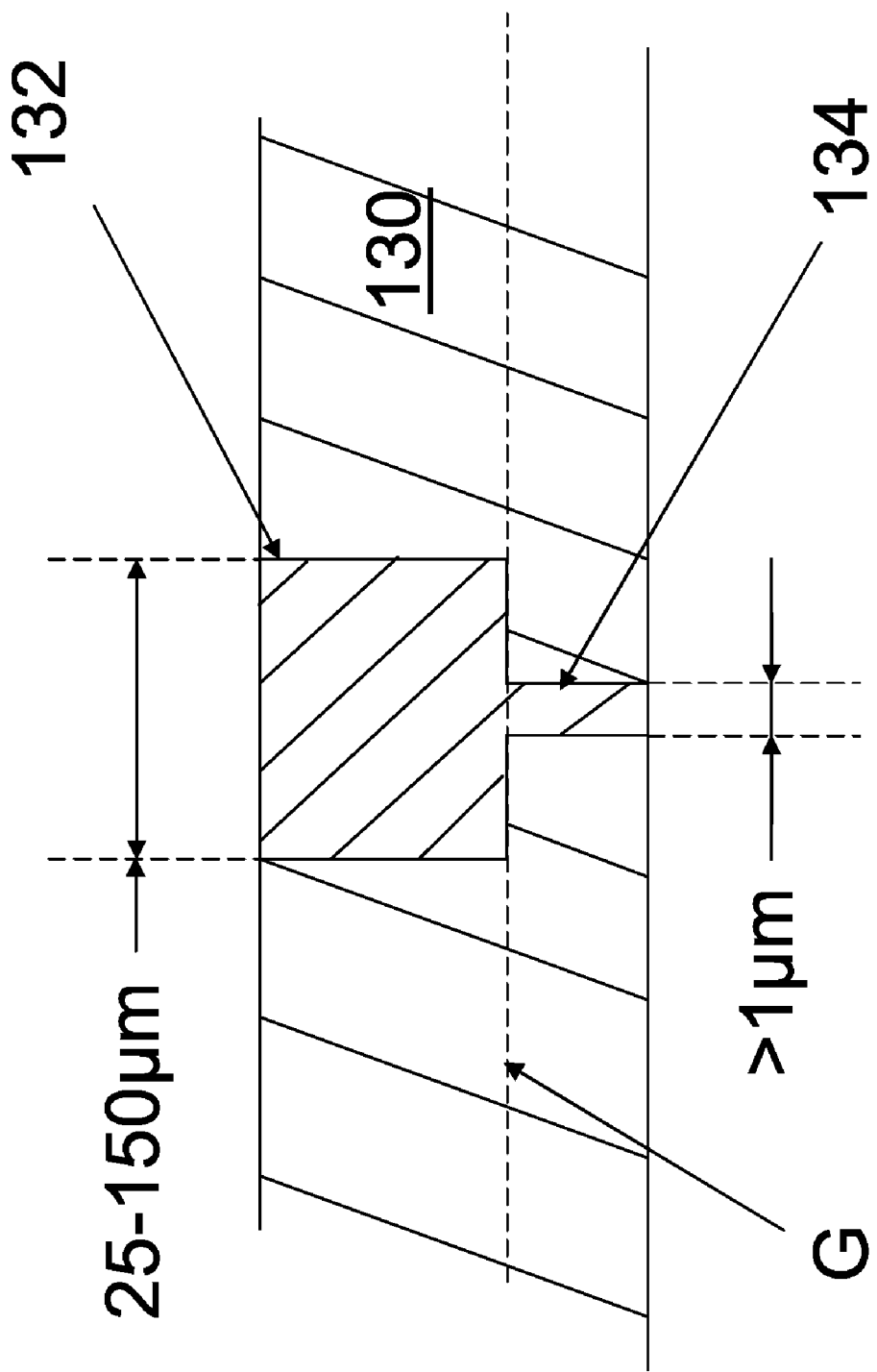
FIG. 13 illustrates an embodiment of the invention for controlling outflow of metal on the back side of a wafer.

In a further embodiment of the invention, which is schematically shown in FIG. 13, the exit hole (back side) is simply made smaller than the front side hole. In this embodiment the via hole is made in two steps. First a small hole 134 is made in a wafer 130 by lithography and e.g. DRIE etching, down to a desired depth. Then, a second patterning and etching is performed to create a wider hole 132, suitably but not necessarily concentric with the smaller hole. As shown in FIG. 13 the dimensions of the different portions of the hole structure is as follows: Wafer thickness 300-675 μm, width of the wider via hole 25-150 μm, depth of the smaller hole typically about 50 μm, diameter of the smaller hole 1 to several tens of μm.

Alternatively the smaller hole can be made from the back side by patterning and etching.

The via hole is then filled with metal by using any of the previously described methods. Finally the bottom portion of the wafer comprising the smaller hole is removed, e.g. by grinding down to the broken line G, to leave a wafer having a metal via with uniform diameter. In this case there will be no bumps formed.

Figure 14:
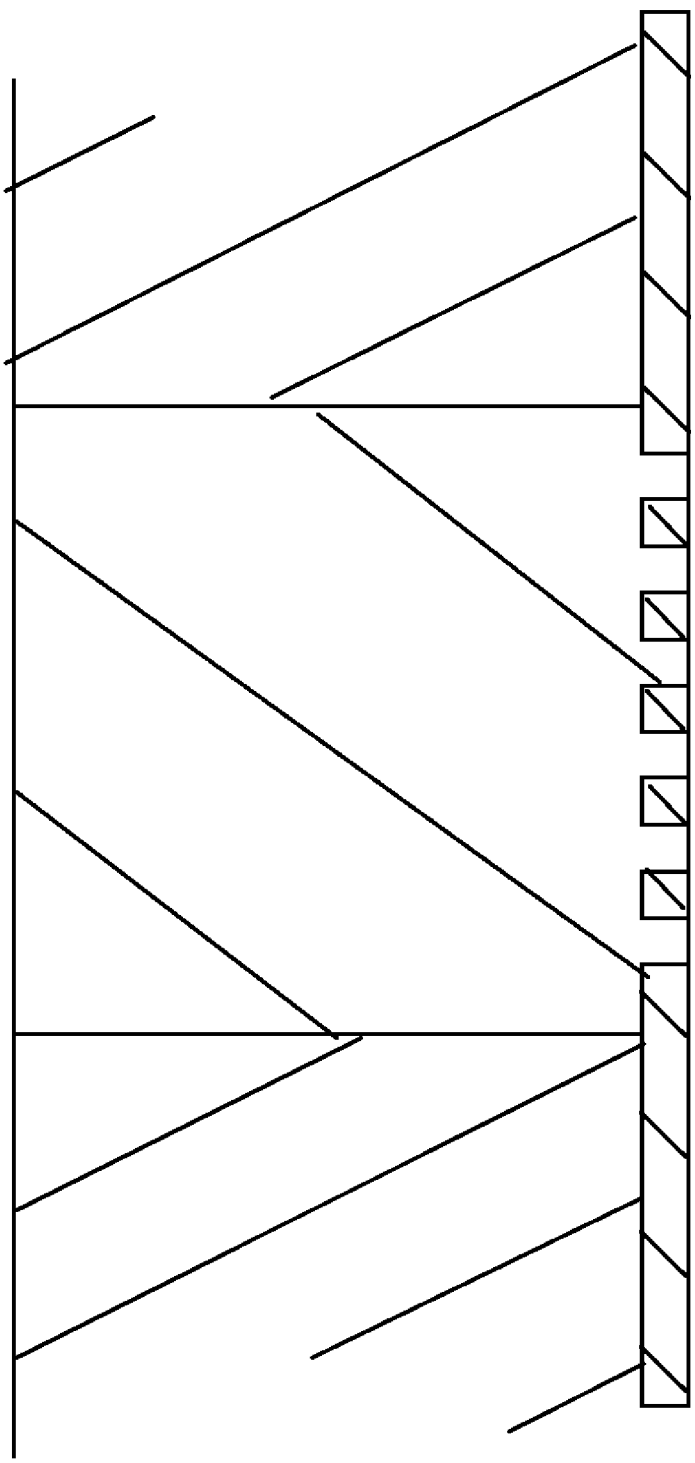
FIG. 14 illustrates another embodiment of the invention for controlling outflow of metal on the back side of a wafer.
Figure 15:
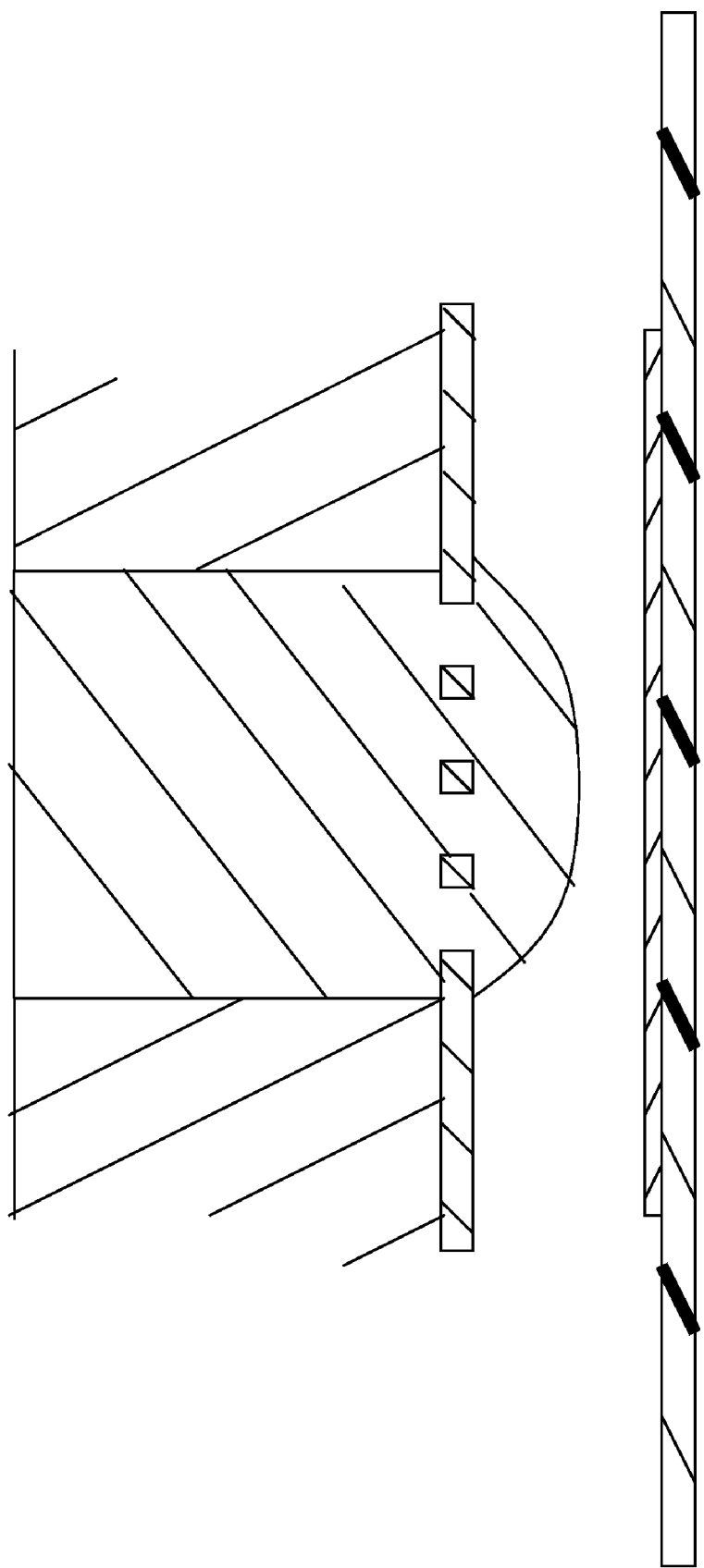
FIG. 15 shows a controlled bump formation according to the invention.

In a second embodiment of the invention illustrated in FIGS. 14 and 15 there is provided a thin membrane covering the wider via hole, the membrane having a plurality of smaller holes, of the order of 1 to 10 μm in diameter, schematically illustrated in FIG. 14. The membrane is suitably an oxide membrane. In order to make this structure the wafer is coated on its back side with an oxide layer. This oxide is suitably patterned by e.g. lithographic techniques or any other suitable technique to define the small holes, and etched to open up the holes.

This process can be carried out both before and after the via hole is made.

These small "venting" holes will allow air or ambient atmosphere to vent out during the filling of the hole with molten metal. It is suitable and preferred to apply sucking for drawing the molten material down into the hole, this being enabled by the provision of the small holes.

Furthermore, by making the holes in the membrane small enough the metal will be prevented from passing through by virtue of the surface tension of the metal. This is illustrated in FIG. 14 wherein the metal has not been capable of flowing out through the holes.

However, the size of the holes in the membrane can be tailored in size to allow metal to pass through to some extent in a controlled manner. This is schematically illustrated in FIG. 15. In this way bumps can be created with controlled sizes on the back side of the wafer, such bumps being usable as solder bumps for further processing, such as for mounting on a circuit board, or for "flip-chip-bonding".

Further in accordance with the present invention it is possible to make coaxial type lead through structures as wafer through connections, which is especially desirable for RF applications.

Figure 16:
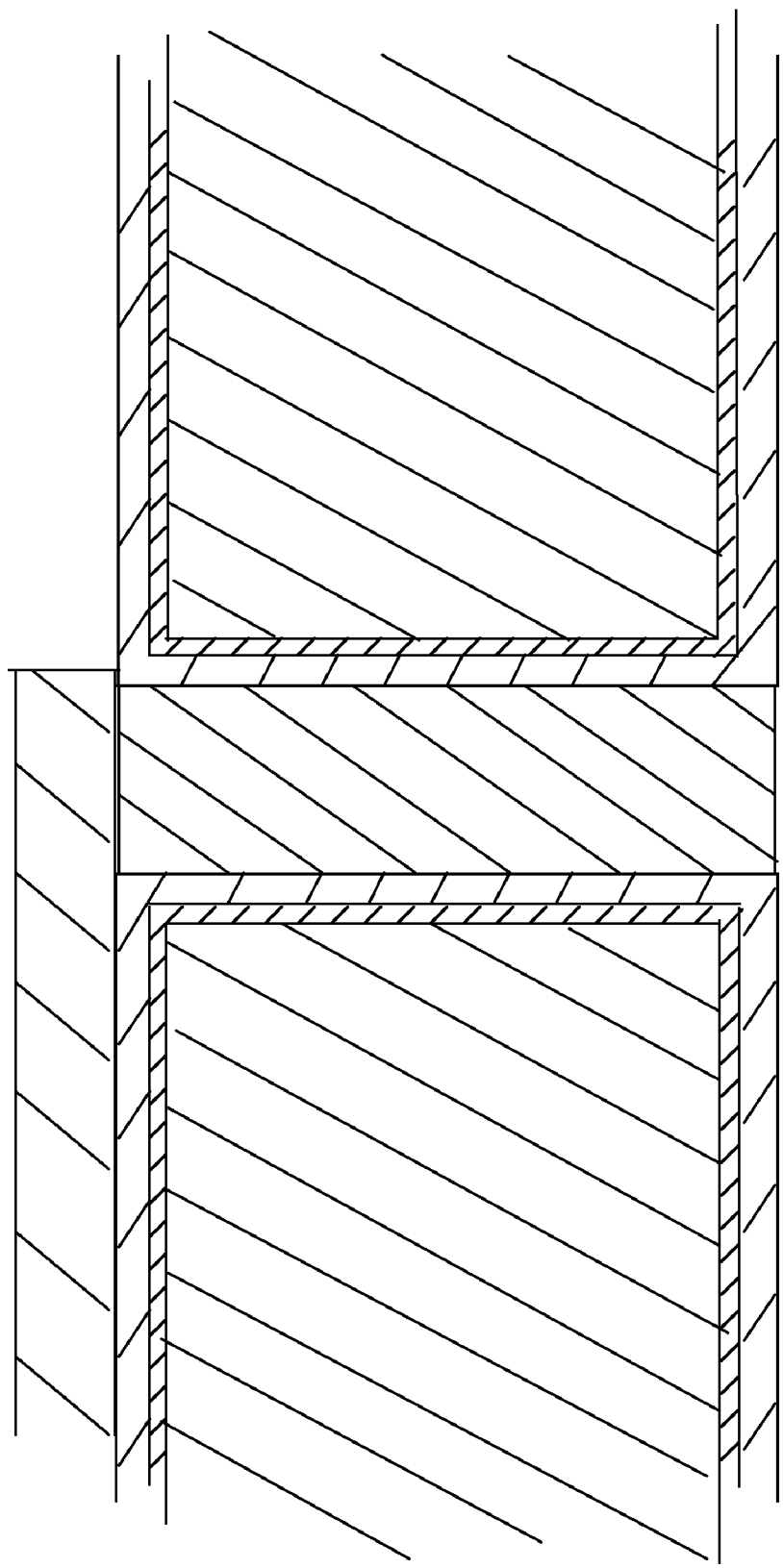
FIG. 16 shows a coaxial type lead through according to the invention.

This is schematically illustrated in FIG. 16. A via hole is made as previously described herein, and the wafer is metalized such that at least the inner walls of the holes are coated with a thin metal layer, which will form a shield of the coaxial lead through.

Then a dielectric is deposited so as to coat the metal shield layer. This can be done by a variety of deposition methods well known to the skilled man. Finally the via hole is filled with metal using any of the disclosed techniques according to the invention.

A routing structure for the RF via can be made either by conventional means (as shown in FIG. 16) by depositing a metal pattern on the wafer, or preferably by the method according to the invention described in connection with FIG. 12.

The invention claimed is:

1. A method of providing a planar substrate with electrical through connections (vias), the method comprising:
   a) providing at least one hole in a planar substrate;
   b) treating the planar substrate such that a surface of the planar substrate exhibits a lower wettability than walls inside the hole;
   c) exposing the planar substrate to a molten material with low resistivity, whereby the molten material is drawn into the hole by capillary force or by wetting force; and
   d) providing polysilicon both inside the hole and on restricted portions around the hole defining a pattern of polysilicon.

2. The method of claim 1, wherein the planar substrate is a semiconductor wafer, preferably selected from silicon, doped silicon, GaAs, InP.

3. The method of claim 1, wherein the surface of the planar substrate is oxidized or provided with Ti or other suitable material to provide a non-wettable surface or at least a surface having lower wettability than that present in the hole.

4. The method of claim 1, wherein polysilicon is deposited in the hole.

5. The method of claim 1, wherein silicon is the native material of the planar substrate.

6. The method of claim 1, wherein exposing the planar substrate to the molten material includes depositing gold on the polysilicon and heating to a temperature of 363° C. or more to form a eutectic liquid phase between silicon and gold.

7. The method of claim 6, wherein the gold is provided on the planar substrate in a solid, semi-liquid or liquid state.

8. The method of claim 6, wherein the gold is provided on the planar substrate by any of sputtering, evaporation, screen-printing or rolling or raking of a paste, attaching a preform and subsequently heat is applied to melt the gold.

9. The method of claim 1, wherein the hole has a front side opening into which the molten material flows during filling thereof, and a back side opening.

10. The method of claim 9, wherein the back side opening is smaller than the first opening.

11. The method of claim 9, wherein the diameter of said back side opening is small enough to reduce the outflow of the molten material but still allows venting of ambient gas present inside the hole.

12. The method of claim 1, comprising active sucking to draw the molten material into the hole.

13. The method of claim 1 or 6, comprising patterning the polysilicon to define routing structures.

14. A method of providing a planar substrate with electrical through connections (vias), the method comprising: a) providing at least one hole in a planar substrate; b) treating the planar substrate such that a surface of the planar substrate exhibits a lower wettability than walls inside the hole; c) exposing the planar substrate to a molten material with low resistivity, whereby the molten material is drawn into the hole by capillary force or by wetting force; d) metallizing the entire planar substrate to provide a shielding layer; and e) providing a dielectric layer, such that the final structure is a coaxial lead-through suitable for RF applications.

15. A method of providing a planar substrate with electrical through connections (vias), the method comprising:
   a) providing at least one hole in a planar substrate;
   treating the planar substrate such that a surface of the planar substrate exhibits a lower wettability than walls inside the hole;
   exposing the planar substrate to a molten material with low resistivity, whereby the molten material is drawn into the hole by capillary force or by wetting force; and
   making recesses in the planar substrate extending from the hole to other locations on the planar substrate, the recesses being exposed to the same processing as the holes so as to form routing structures on the planar substrate.

* * * * *

UNITED STATES PATENT AND TRADEMARK OFFICE
Certificate

Patent No. 8,324,103 B2　　　　　　　　　　　　　　　　　　　　Patented: December 4, 2012

On petition requesting issuance of a certificate for correction of inventorship pursuant to 35 U.S.C. 256, it has been found that the above identified patent, through error and without any deceptive intent, improperly sets forth the inventorship.
   Accordingly, it is hereby certified that the correct inventorship of this patent is: Tomas Bauer, Bro (SE); Edvard Kälvesten, Hagersten (SE); and Thorbjörn Ebefors, Huddinge (SE).

Signed and Sealed this Eighteenth Day of February 2014.

*MATTHEW C. LANDAU*
*Supervisory Patent Examiner*
*Art Unit 2891*
*Technology Center 2800*